United States Patent
Jiang et al.

(10) Patent No.: US 11,788,184 B2
(45) Date of Patent: Oct. 17, 2023

(54) FUNCTIONAL CURTAIN FABRIC WITH ANHYDROUS COATING LAYER AND METHOD FOR MANUFACTURING SAME

(71) Applicant: The Hong Kong Research Institute of Textiles and Apparel Limited, Hong Kong (HK)

(72) Inventors: Shou-Xiang Kinor Jiang, Hong Kong (HK); Jiangtao Xu, Hong Kong (HK); Dagang Miao, Hong Kong (HK); Yishu Yan, Hong Kong (HK); Qingxin Peng, Hong Kong (HK)

(73) Assignee: The Hong Kong Research Institute of Textiles and Apparel Limited, Hong Kong (HK)

( * ) Notice: Subject to any disclaimer, the term of this patent is extended or adjusted under 35 U.S.C. 154(b) by 1020 days.

(21) Appl. No.: 16/495,982

(22) PCT Filed: Mar. 24, 2017

(86) PCT No.: PCT/CN2017/078122
§ 371 (c)(1),
(2) Date: Sep. 20, 2019

(87) PCT Pub. No.: WO2018/170899
PCT Pub. Date: Sep. 27, 2018

(65) Prior Publication Data
US 2020/0149150 A1    May 14, 2020

(30) Foreign Application Priority Data
Mar. 20, 2017   (CN) .......................... 201710166204.6

(51) Int. Cl.
| | |
|---|---|
| *C23C 14/58* | (2006.01) |
| *C23C 14/02* | (2006.01) |
| *D06M 10/06* | (2006.01) |
| *C23C 14/20* | (2006.01) |
| *C23C 14/35* | (2006.01) |
| *B82Y 30/00* | (2011.01) |
| *D06M 101/32* | (2006.01) |

(52) U.S. Cl.
CPC .......... *C23C 14/584* (2013.01); *C23C 14/021* (2013.01); *C23C 14/205* (2013.01); *C23C 14/352* (2013.01); *D06M 10/06* (2013.01); *B82Y 30/00* (2013.01); *D06M 2101/32* (2013.01); *D06M 2200/12* (2013.01); *D06M 2200/25* (2013.01)

(58) Field of Classification Search
CPC ....... B82Y 30/00; B82Y 40/00; C23C 14/584; C23C 14/021; C23C 14/205; C23C 14/352; C23C 14/35; D06M 10/06; D06M 2101/32; D06M 2200/12; D06M 2200/25; D06M 13/00; D06M 15/572; D06M 16/00; D06M 11/83; D06M 13/224
USPC ...................................................... 204/192.14
See application file for complete search history.

(56) References Cited

FOREIGN PATENT DOCUMENTS

| | | |
|---|---|---|
| CN | 101033546 A | 9/2007 |
| CN | 104191720 A | 12/2014 |
| CN | 104695209 A | 6/2015 |
| CN | 105862000 A | 8/2016 |

OTHER PUBLICATIONS

Machine Translation, Qiao, CN 104695209 A, Jun. 2015. (Year: 2015).*
International Search Report of PCT Patent Application No. PCT/CN2017/078122 dated Aug. 29, 2017.

* cited by examiner

*Primary Examiner* — Rodney G McDonald

(57) ABSTRACT

Disclosed is a functional curtain fabric with an anhydrous coating layer. The functional curtain fabric is manufactured by method comprising step S1, preprocessing a fabric substrate; step S2, placing the preprocessed fabric substrate in step S1 into vacuum chamber of magnetron sputtering machine for coating: sputtering a metal onto the fabric substrate by using magnetron sputtering technology, so as to form a nano-metal film on the fabric substrate; and step S3, performing anti-oxidation treatment on the fabric substrate covered with the nano-metal film. The functional curtain fabric with an anhydrous coating layer can serve as an effective heat shield against exterior sunlight while having good light transmission. In addition, the functional curtain fabric with an anhydrous coating layer has good antimicrobial properties due to use of a metal coating of silver and titanium, and also has a degree of water resistance due to the nano-metal layer of silver and titanium.

2 Claims, 1 Drawing Sheet

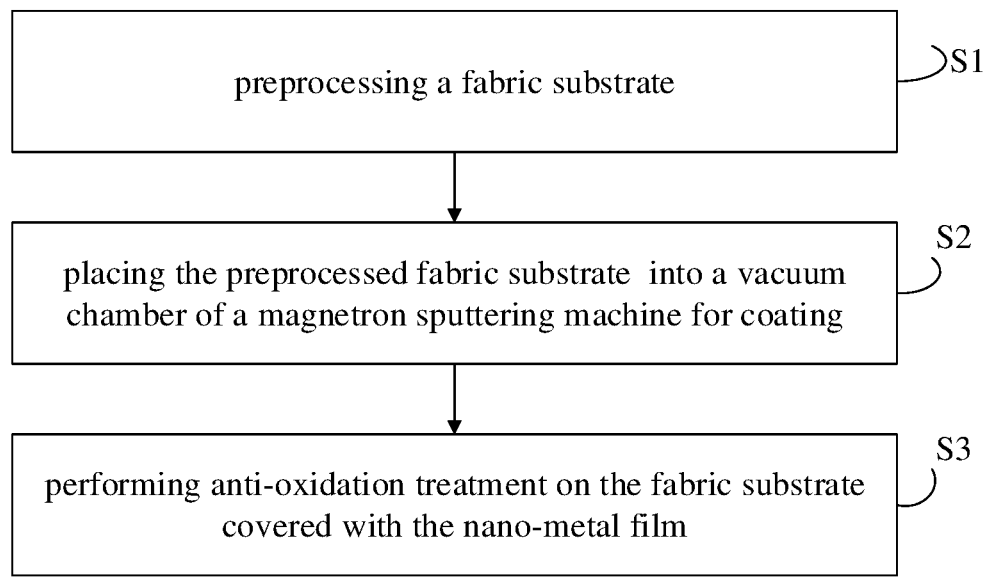

FUNCTIONAL CURTAIN FABRIC WITH ANHYDROUS COATING LAYER AND METHOD FOR MANUFACTURING SAME

TECHNICAL FIELD

The present application relates to the technical field of textiles, and more specially relates to a functional curtain fabric with an anhydrous coating layer and method for manufacturing same.

BACKGROUND OF THE INVENTION

At present, besides protecting privacy and decorating beauty, traditional curtains only protect dust, sand and light, but have little protection against heat. In hot summer, outdoor high-temperature heat energy is easily transmitted to the indoor through the form, so it is necessary to increase the use of refrigeration equipment; in cold winter, indoor heat energy is also easily transmitted to the outdoor, thus increasing the working time and intensity of heating equipment. The above situation deviates from the environmental protection theme of energy conservation and emission reduction, which has seriously increased energy consumption and carbon emissions.

The thick curtain fabrics could shade the room from the scorching sun, but the indoor light is weak; the thin curtain fabrics could keep the indoor light comfortable, but could not block the sun. Thus a functional curtain fabric which can provide the production with heat shielding and a comfortable indoor light is needed.

TECHNICAL PROBLEM

The purpose of the present application is to provide a functional curtain fabric with an anhydrous coating layer and method for manufacturing same to provide a functional curtain fabric which can provide the production with heat shielding and a comfortable indoor light.

TECHNICAL SOLUTION

A functional curtain fabric with an anhydrous coating layer is proposed, the functional curtain fabric is manufactured by a method comprising:
step S1, preprocessing a fabric substrate: washing the fabric substrate with a detergent for 30-60 minutes to remove organic solvents, dust and the like on a surface of the fabric, then washing the fabric substrate repeatedly with deionized water and drying the fabric substrate in an oven at 40~45° C.;
step S2, placing the preprocessed fabric substrate in step S1 into a vacuum chamber of a magnetron sputtering machine for coating:
vacuuming a sputtering chamber to make a background vacuum reach $5\times10^{-3}$ Pa, injecting argon gas with a purity of 99.95% into the sputtering chamber to make a working pressure reach 0.25 Pa, setting a target base distance to be 10 cm, a sputtering current of silver target to be 1 A and a sputtering current of titanium target to be 6 A; sputtering a metal target onto the fabric substrate by using magnetron sputtering technology, so as to form a nano-metal film on the fabric substrate;
step S3, performing anti-oxidation treatment on the fabric substrate covered with the nano-metal film, process parameters of the anti-oxidation treatment are as follows: rolling pressure is 3 kg/m$^2$, speed is 9 m/s, drying temperature is 160° C.

Preferably, the fabric substrate is polyester fabric.
Preferably, the target is silver and titanium.
Preferably, in the step S2, first sputtering silver onto the fabric substrate, then sputtering titanium onto the fabric substrate.
Preferably, in step S3, when performing the anti-oxidation treatment, an antioxidant used is a mixed solution of NAO-2, IMPRANIL DL 1537, P37 and DOS, process parameters of the anti-oxidation treatment are as follows: rolling pressure is 3 kg/m$^2$, speed is 9 m/s, drying temperature is 160° C.

Accordingly, a manufacturing method for the above functional curtain fabric with an anhydrous coating layer is also proposed, the manufacturing method comprising the following steps:
step S1, preprocessing a fabric substrate: washing the fabric substrate with a detergent for 30-60 minutes to remove organic solvents, dust and the like on a surface of the fabric, then washing the fabric substrate repeatedly with deionized water and drying the fabric substrate in an oven at 40~45° C.;
step S2, placing the preprocessed fabric substrate in step S1 into a vacuum chamber of a magnetron sputtering machine for coating:
vacuuming a sputtering chamber to make a background vacuum reach $5\times10^{-3}$ Pa, injecting argon gas with a purity of 99.95% into the sputtering chamber to make a working pressure reach 0.25 Pa, setting a target base distance to be 10 cm, a sputtering current of silver target to be 1 A and a sputtering current of titanium target to be 6 A; sputtering a metal target onto the fabric substrate by using magnetron sputtering technology, so as to form a nano-metal film on the fabric substrate;
step S3, performing anti-oxidation treatment on the fabric substrate covered with the nano-metal film, process parameters of the anti-oxidation treatment are as follows: rolling pressure is 3 kg/m$^2$, speed is 9 m/s, drying temperature is 160° C.

Preferably, the fabric substrate is polyester fabric.
Preferably, the target is silver and titanium.
Preferably, in the step S2, first sputtering silver onto the fabric substrate, then sputtering titanium onto the fabric substrate.
Preferably, in step S3, when performing the anti-oxidation treatment, an antioxidant used is a mixed solution of NAO-2, IMPRANIL DL 1537, P37 and DOS, process parameters of the anti-oxidation treatment are as follows: rolling pressure is 3 kg/m$^2$, speed is 9 m/s, drying temperature is 160° C.

THE BENEFICIAL EFFECT OF THE INVENTION

Implementing embodiments of the present application has the following beneficial effects: according to the functional curtain fabric with an anhydrous coating layer, the silver and titanium are successively sputtered onto the fabric substrate by using magnetron sputtering technology, so as to form a nano-metal film on the fabric substrate, thus it can serve as an effective heat shield against exterior sunlight while having good light transmission. In addition, the functional curtain fabric with an anhydrous coating layer has good antimicrobial properties due to the use of a metal coating of silver and titanium, and also has a degree of water resistance due to the nano-metal layer of silver and titanium.

BRIEF DESCRIPTION OF THE DRAWINGS

In order to more clearly illustrate the embodiments of the present application or the technical solutions in the prior art, the drawings used in the embodiments or the prior art description will be briefly introduced below. Obviously, the drawings in the following description are only some embodiments of the present application, and those skilled in the art can obtain other drawings according to these drawings without any creative work.

FIG. 1 is a flow chart of the manufacturing method for the functional curtain fabric with an anhydrous coating layer according to the embodiment of the present application.

EMBODIMENT OF THE INVENTION

The technical solutions in the embodiments of the present application are clearly and completely described in the following with reference to the accompanying drawings in the embodiments of the present application. Obviously, the described embodiments are only part of the embodiments of the present application, not all of them. Based on the embodiments of the present application, all other embodiments obtained by those skilled in the art without creative efforts are within the scope of the present application.

FIG. 1 is a flow chart of the manufacturing method for the functional curtain fabric with an anhydrous coating layer according to the embodiment of the present application. As shown in FIG. 1, the manufacturing method comprises the following steps:

step S1, preprocessing a fabric substrate: washing the fabric substrate with a detergent for 30-60 minutes to remove organic solvents, dust and the like on a surface of the fabric, then washing the fabric substrate repeatedly with deionized water and drying the fabric substrate in an oven at 40~45° C.;

step S2, placing the preprocessed fabric substrate in step S1 into a vacuum chamber of a magnetron sputtering machine for coating:

vacuuming a sputtering chamber to make a background vacuum reach $5 \times 10^{-3}$ Pa, injecting argon gas with a purity of 99.95% into the sputtering chamber to make a working pressure reach 0.25 Pa, setting a target base distance to be 10 cm, a sputtering current of silver target to be 1 A and a sputtering current of titanium target to be 6 A; sputtering a metal target onto the fabric substrate by using magnetron sputtering technology, so as to form a nano-metal film on the fabric substrate;

step S3, performing anti-oxidation treatment on the fabric substrate covered with the nano-metal film, process parameters of the anti-oxidation treatment are as follows: rolling pressure is 3 kg/m$^2$, speed is 9 m/s, drying temperature is 160° C.

Embodiment 1

Preprocessing a fabric: washing the polyester fabric with a detergent for 30-60 minutes to remove organic solvents, dust and the like on a surface of the fabric, then washing the fabric repeatedly with deionized water and drying the fabric substrate in an oven at 40~45° C.

Magnetron sputtering coating: vacuuming a sputtering chamber to make a background vacuum reach $5 \times 10^{-3}$ Pa, injecting argon gas with a purity of 99.95% into the sputtering chamber to make a working pressure reach 0.25 Pa, setting a target base distance to be 10 cm, a sputtering current of silver target to be 1 A and a sputtering current of titanium target to be 6 A; sputtering a metal target onto the fabric substrate by using magnetron sputtering technology, so as to form a nano-metal film on the fabric substrate Anti-oxidation treatment: using a mixed solution of NAO-2, IMPRANIL DL 1537, P37 and DOS to perform anti-oxidation treatment on the fabric substrate covered with the nano-metal film; process parameters of the anti-oxidation treatment are as follows: rolling pressure is 3 kg/m$^2$, speed is 9 m/s, drying temperature is 160° C.

Table 1 shows the comparison of functional curtain fabrics prepared according to the present application and ordinary curtain fabrics without coating treatment in terms of infrared transmittance, ultraviolet protection factor (UPF), water repellency, washing ability, anti-bacteria and room temperature. The Perkin Elmer Spectrum 100 spectrophotometer was used to measure the infrared radiation reflectivity of fabrics, and the UV radiation penetration of fabrics was evaluated with a UV-visible spectrophotometer (Varian, Cary 300 Conc) in the wavelength range of 280 to 400 nm. The UPF results were calculated using the method described in the British standard BS EN 13758-1:2002-10-01. According to AATCC-61, AATCC-132, AATCC-16 and ATCC-8, the washing ability of polyester fabrics was tested by washing fastness, dry cleaning fastness, light fastness and friction fastness. The results show that the functional curtain fabric provided by the application has good thermal shielding and washing resistance, and can effectively resist bacteria.

|  | IR transmittance | UPF | Water repellency | Wash ability | Anti-bacteria | Room temperature |
|---|---|---|---|---|---|---|
| Before coating | 37.9% | 20.36 | — | — | Bad | 29° C. |
| After coating | 1.5% | 71 | 1100 | 4/5 | Good | 27.6° C. |

According to the manufacturing method for the functional curtain fabric with an anhydrous coating layer, the silver and titanium are successively sputtered onto the fabric substrate by using magnetron sputtering technology, so as to form a nano-metal film on the fabric substrate, thus it can serve as an effective heat shield against exterior sunlight while having good light transmission. In addition, the functional curtain fabric with an anhydrous coating layer has good antimicrobial properties due to the use of a metal coating of silver and titanium, and also has a degree of water resistance due to the nano-metal layer of silver and titanium.

The above is only a preferred embodiment of the present application, and of course, the scope of the present application cannot be limited thereto. Those skilled in the art can understand that all or part of the process of implementing the above embodiments, and equivalent changes made according to the claims of the present application, still fall within the scope of the application.

What is claimed is:

1. A manufacturing method for a functional curtain fabric with an anhydrous coating layer, wherein, the manufacturing method comprising the following steps:

step S1, preprocessing a fabric substrate: washing the fabric substrate with a detergent for 30-60 minutes to remove organic solvents, dust on a surface of the fabric substrate, then washing the fabric substrate repeatedly with deionized water and drying the fabric substrate in an oven at 40~45° C.;

step S2, placing the preprocessed fabric substrate in step S1 into a vacuum chamber of a magnetron sputtering machine for coating:

vacuuming a sputtering chamber to make a background vacuum reach $5 \times 10^{-3} \sim 4 \times 10^{-4}$ Pa, injecting argon gas with a purity of 99.95% into the sputtering chamber to make a working pressure reach 0.25 Pa, setting a target-substrate distance to be 10 cm; by using magnetron sputtering, successively sputtering silver and titanium onto the fabric substrate with a sputtering current of 6A for silver and 1A for titanium to form a nano-metal film on the fabric substrate;

step S3, using a mixed solution of anti-oxidants to perform anti-oxidation treatment on the fabric substrate covered with the nano-metal film, process parameters of the anti-oxidation treatment are as follows: rolling pressure is 3 kg/m$^2$, speed is 9 m/s, drying temperature is 160° C.

2. The manufacturing method for the functional curtain fabric with an anhydrous coating layer according to claim 1, wherein, the fabric substrate is polyester fabric.

* * * * *